United States Patent
Oh et al.

(10) Patent No.: US 10,957,835 B2
(45) Date of Patent: Mar. 23, 2021

(54) LIGHT EMITTING ELEMENT AND METHOD FOR FABRICATING THE SAME

(71) Applicant: LUMENS CO., LTD., Yongin-si (KR)

(72) Inventors: Seunghyun Oh, Yongin-si (KR); Sungsik Jo, Yongin-si (KR); Junghyun Park, Yongin-si (KR); Byeonggeon Kim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/717,456

(22) Filed: Dec. 17, 2019

(65) Prior Publication Data

US 2020/0127183 A1 Apr. 23, 2020

Related U.S. Application Data

(63) Continuation of application No. 16/039,732, filed on Jul. 19, 2018, now Pat. No. 10,546,989.

(30) Foreign Application Priority Data

Aug. 18, 2017 (KR) .................. 10-2017-0105058

(51) Int. Cl.
*H01L 33/62* (2010.01)
*H01L 33/00* (2010.01)
*H01L 33/36* (2010.01)
*H01L 33/38* (2010.01)

(52) U.S. Cl.
CPC ............ *H01L 33/62* (2013.01); *H01L 33/005* (2013.01); *H01L 33/36* (2013.01); *H01L 33/38* (2013.01); *H01L 2933/0066* (2013.01)

(58) Field of Classification Search
CPC ... H01L 33/62; H01L 33/005; H01L 33/0095; H01L 33/36; H01L 33/38; H01L 2933/0066
USPC ............................................. 257/99
See application file for complete search history.

(56) References Cited

U.S. PATENT DOCUMENTS

| | | | |
|---|---|---|---|
| 2016/0111614 A1* | 4/2016 | Lee ........................ | H01L 33/483 257/98 |
| 2016/0218262 A1* | 7/2016 | Aketa .................... | H01K 33/22 |
| 2016/0372646 A1* | 12/2016 | Yoon ...................... | H05B 45/20 |

* cited by examiner

*Primary Examiner* — Tu-Tu V Ho
(74) *Attorney, Agent, or Firm* — Mei & Mark LLP

(57) ABSTRACT

A light emitting element is disclosed. The light emitting element includes: an LED chip including a light emitting semiconductor stack and first and second electrode pads disposed under the light emitting semiconductor stack and spaced apart from each other; a substrate mounted with the LED chip and including a first electrode corresponding to the first electrode pad and a second electrode corresponding to the second electrode pad; a first solder portion connecting the first electrode pad and the first electrode; and a second solder portion connecting the second electrode pad and the second electrode. The first solder portion and the second solder portion are formed without escaping from the mounting area of the LED chip on the substrate by heating a solder material to its melting point or above with an IR laser.

19 Claims, 5 Drawing Sheets

LIGHT EMITTING ELEMENT AND METHOD FOR FABRICATING THE SAME

This is a continuation of U.S. patent application Ser. No. 16/039,732, filed Jul. 19, 2018, which is incorporated herein by reference.

BACKGROUND OF THE INVENTION

1. Field of the Invention

The present invention relates to a light emitting element, and more specifically to a light emitting element in which a solder bonding an LED chip to a substrate is prevented from being squeezed out from the mounting area of the LED chip so that the luminous efficiency of the light emitting element is prevented from being lowered by the squeezed-out solder.

2. Description of the Related Art

A light emitting element including a substrate and a flip-type LED chip flip-bonded to the substrate is known. The flip-type LED chip of the light emitting element includes a first electrode pad connected to a first conductive semiconductor layer and a second electrode pad connected to a second conductive semiconductor layer. The substrate of the light emitting element includes a first lead electrode electrically connected to the first electrode pad and a second lead electrode electrically connected to the second electrode pad. A solder material is used to connect the first and second electrode pads to the first and second lead electrodes, respectively. The electrode pads are connected to the corresponding electrodes by reflow soldering to mount the flip-chip LED chip on the substrate. For uniform distribution of the solder, the solder is applied to an area equal to or greater than the bottom area of the LED chip (i.e. the mounting area of the LED chip) on the substrate. Thereafter, the LED chip is placed on the substrate, followed by reflow soldering.

However, the solder covers the lateral sides of the LED chip and absorbs light emitted from the LED chip, with the result that the about 3% to about 4% of the light is lost. Further, flux remaining in the light emitting element tends to discolor, resulting in an unwanted change in color coordinates. Moreover, non-uniform heat applied to the solder during reflow soldering causes a difference in the degree of melting, resulting in the formation of voids that deteriorate the electrical conductivity and reliability of the solder. The fabrication of the light emitting element requires an additional process for inspecting bonding defects through sporadic sampling. The inspection of bonding defects is also inaccurate.

SUMMARY OF THE INVENTION

It is one object of the present invention to provide a light emitting element in which a solder bonding an LED chip to a substrate is prevented from being squeezed out from the mounting area of the LED chip so that the luminous efficiency of the light emitting element is prevented from being lowered by the squeezed-out solder.

It is another object of the present invention to provide a method for fabricating a light emitting element in which an IR laser is used to bond an LED chip to a substrate through a solder so that a reduced amount of the solder can be used and escape of the solder from the mounting area of the LED chip can be minimized.

A light emitting element according to one aspect of the present invention includes: an LED chip including a light emitting semiconductor stack and first and second electrode pads disposed under the light emitting semiconductor stack and spaced apart from each other; a substrate mounted with the LED chip and including a first electrode corresponding to the first electrode pad and a second electrode corresponding to the second electrode pad; a first solder portion connecting the first electrode pad and the first electrode; and a second solder portion connecting the second electrode pad and the second electrode, wherein the first solder portion and the second solder portion are formed without escaping from the mounting area of the LED chip on the substrate by heating a solder material to its melting point or above with an IR laser.

According to one embodiment, the first solder portion and the second solder portion may be formed by completely melting the solder material with an IR laser and curing the molten solder material.

According to one embodiment, the contact area between the first solder portion and the first electrode pad is delimited by the edges of the first electrode pad and the contact area between the second solder portion and the second electrode pad is delimited by the edges of the second electrode pad.

According to one embodiment, the light emitting semiconductor stack includes a light-transmitting substrate, a first conductive semiconductor layer, an active layer, and a second conductive semiconductor layer formed in this order from the top to the bottom, an interconnection layer is formed under the second conductive semiconductor layer and over the first and second electrode pads, the interconnection layer includes a conductive reflection layer formed under the second conductive semiconductor layer, a first insulating layer formed under the conductive reflection layer, an intermediate conductive layer formed under the first insulating layer and consisting of a first intermediate conductive portion and a second intermediate conductive portion spaced apart from each other, a second insulating layer formed under the intermediate conductive layer and to which the underlying first and second electrode pads spaced apart from each other are bonded, a first via surrounded by an insulating cover and connecting the first conductive semiconductor layer and the first intermediate conductive portion, a second via connecting the first intermediate conductive portion and the first electrode pad, a third via connecting the conductive reflection layer and the second intermediate conductive portion, and a fourth via connecting the second intermediate conductive portion and the second electrode pad, the first electrode pad has a smaller area than the first intermediate conductive portion, and the second electrode pad has a larger area than the second intermediate conductive portion.

The area of the first electrode pad may be identical to that of the second electrode pad. With these dimensions, the first electrode pad and the second electrode pad have the largest possible areas and are almost identical in area under given conditions while achieving improved current spreading effect. As a result, the areas of the first solder portion and the second solder portion in contact with the inner portions of the bottom areas of the first electrode pad and the second electrode pad, respectively, are maximized and are almost identical, ensuring stable and reliable bonding.

According to one embodiment, the first solder portion has a reference width in the portion in contact with the first electrode pad and a maximum width in the middle of its thickness, and orthogonal projections of the reference width and the maximum width of the first solder portion onto the first electrode pad are within the area defined by the edges of the first electrode pad.

According to one embodiment, the second solder portion has a reference width in the portion in contact with the second electrode pad and a maximum width in the middle of its thickness, and orthogonal projections of the reference width and the maximum width of the second solder portion onto the second electrode pad are within the area defined by the edges of the second electrode pad.

A method for fabricating a light emitting element according to another aspect of the present invention includes: preparing an LED chip including a light emitting semiconductor stack and first and second electrode pads disposed under the light emitting semiconductor stack and spaced apart from each other and a substrate including a first electrode corresponding to the first electrode pad and a second electrode corresponding to the second electrode pad; and applying a solder material to the first electrode and the second electrode, loading the LED chip on the substrate in such a direction that the first electrode pad and the second electrode pad face the first electrode and the second electrode, respectively, to interpose the solder material between the first electrode pad and the first electrode and between the second electrode pad and the second electrode, and allowing an IR laser irradiation unit arranged above the LED chip to irradiate an IR laser through the LED chip such that the solder material between the first electrode pad and the first electrode and between the second electrode pad and the second electrode is directly heated by the IR laser.

According to one embodiment, the amounts of the solder material applied to the first electrode and the second electrode are determined such that the solder material heated by the IR laser does not escape from the mounting area of the LED chip.

According to one embodiment, the solder material is applied to a plurality of points of the first electrode and a plurality of points of the second electrode and is heated and melted by the IR laser to form a first solder portion and a second solder portion on the first electrode and the second electrode, respectively.

According to one embodiment, the IR laser is irradiated for 5 seconds or less per LED chip.

According to one embodiment, the IR laser irradiation unit may be used to solder a plurality of LED chips to a plurality of substrates by moving the IR laser irradiation unit in a pattern passing the plurality of LED chips or allowing the plurality of LED chips to move such that the LED chips pass through the IR laser irradiated from the IR laser irradiation unit one after the other.

In the light emitting element of the present invention, the solder bonding the LED chip to the substrate is prevented from being squeezed out from the mounting area of the LED chip so that the luminous efficiency of the light emitting element is prevented from being lowered by the squeezed-out solder. The solder is completely melted, which minimizes the amount of the solder used while meeting existing DST. The solder capable of absorbing light emitted from the LED chip can be prevented from being squeezed out from the mounting area of the LED chip so that an increased amount of light can be emitted from the light emitting element. A large amount of flux is generated during reflow soldering. In contrast, the use of IR laser in the present invention can minimize the generation of flux. In addition, since the solder is melted by an IR laser, the solder can be uniformly heated to its melting point or above within the irradiated area. Therefore, the complete melting of the solder within the irradiated area minimizes the formation of voids possibly caused by non-uniform heating of the solder, leading to high electrical conductivity and reliability of the solder.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings. It should be noted that the drawings and embodiments are simplified and illustrated such that those skilled in the art can readily understand the present invention, and therefore, they should not be construed as limiting the scope of the present invention.

Figure 1:
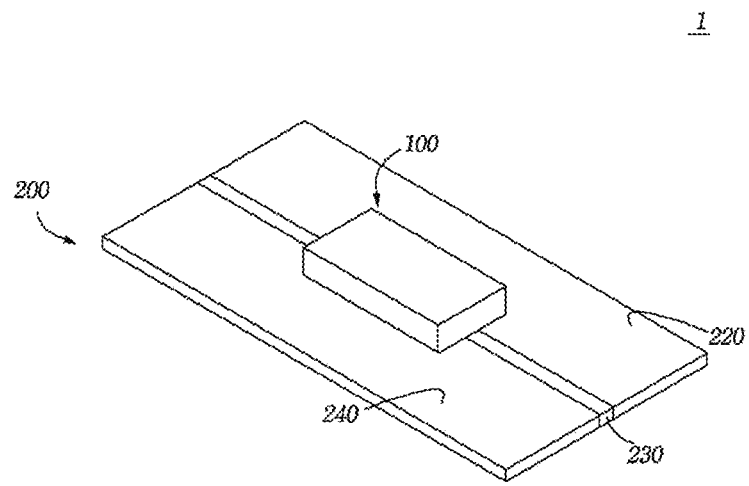
FIG. 1 is a perspective view illustrating a light emitting element according to one embodiment of the present invention.
Figure 2:
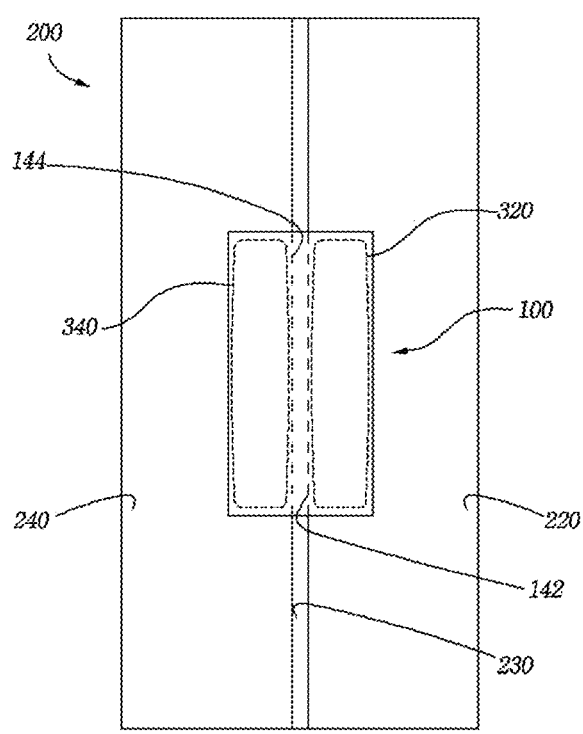
FIG. 2 is a plan view illustrating a light emitting element according to one embodiment of the present invention.
Figure 3:
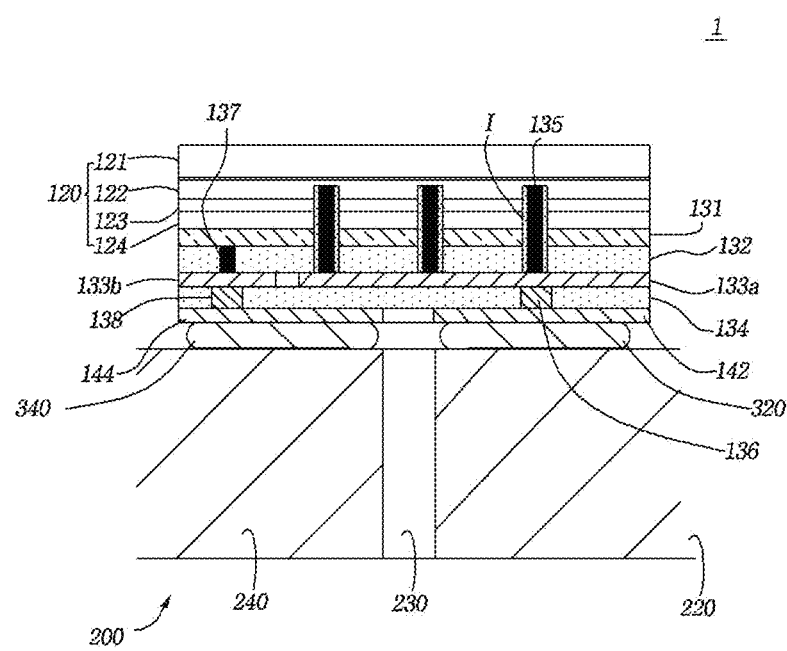
FIG. 3 is a cross-sectional view illustrating a light emitting element according to one embodiment of the present invention.

FIGS. 1 to 3 are perspective, plan, and cross-sectional views of a light emitting element according to one embodiment of the present invention.

As illustrated in FIGS. 1 to 3, the light emitting element 1 includes an LED chip 100 and a substrate 200 mounted with the LED chip 100.

The LED chip 100 includes a light emitting semiconductor stack 120 elongated along its major axis and first and second electrode pads 142 and 144 disposed under the light emitting semiconductor stack 120 and spaced apart from each other.

The first electrode pad 142 and the second electrode pad 144 are elongated along the major axis of the LED chip 100 and are spaced apart from each other along the minor axis of the LED chip 100. The structure in which the first electrode pad 142 and the second electrode pad 144 are elongated along the major axis of the LED chip 100 and are arranged along the minor axis of the LED chip 100 is advantageous in maximizing the contact areas with a first solder portion 320 and a second solder portion 340, which will be explained below.

The substrate 200 includes a first electrode 220 corresponding to the first electrode pad 142, a second electrode 240 corresponding to the second electrode pad 144, and a linear electrode separator 230 separating the two electrodes. The first electrode 220 and the second electrode 240 can be made of a planar conductive metal material. The linear electrode separator 230 is interposed between the first electrode 220 and the second electrode 240 and can be made of an insulating material.

The light emitting element 1 includes first and second solder portions 320 and 340 interposed between the LED chip 100 and the substrate 200 to fix the LED chip 100 to the substrate 200. The first solder portion 320 electrically connects the first electrode pad 142 and the first electrode 220 and the second solder portion 340 electrically connects the second electrode pad 144 and the second electrode 240.

According to one embodiment, the first solder portion 320 and the second solder portion 340 are formed by heating a solder material, for example, in the form of a paste, to its melting point or above with an IR laser for complete melting and curing the molten solder material. The melting of the solder material with an IR laser enables the formation of the solder portions 320 and 340 within the mounting area of the LED chip 100 on the substrate 200. Nevertheless, the use of an IR laser enables complete melting of the solder material without any substantial temperature difference in a short time, leading to uniform distribution of the solder material.

Figure 7:
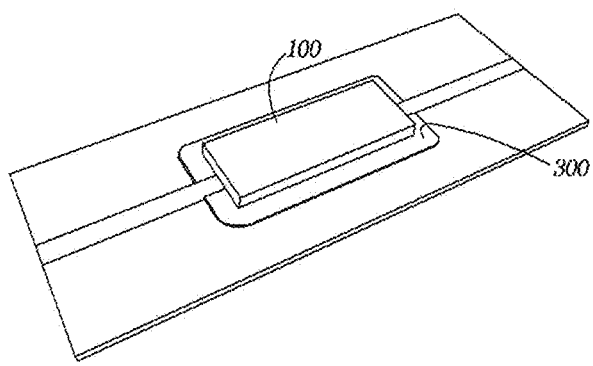
FIG. 7 is a perspective view illustrating a light emitting element fabricated based on reflow soldering bonding.

FIG. 7 illustrates a comparative light emitting element fabricated by mounting the same type of LED chip on the same type of substrate by reflow soldering. A solder portion 300 emerges from the mounting area of the LED chip 100 and covers the lateral lower side of the LED chip 100, achieving high DST. For this reason, the solder portion 300 absorbs a considerable amount of light from the LED chip 100, resulting in a decrease in the luminous efficiency of the light emitting element. Reflow soldering makes the solder portion 300 thermally non-uniform, causing a difference in the degree of melting. As a result, the solder portion has a number of voids that deteriorate the electrical conductivity and reliability of the solder.

As best illustrated in FIG. 3, the light emitting semiconductor stack 120 includes a sapphire substrate 121 as a light-transmitting substrate, and a first conductive semiconductor layer 122, an active layer 123, and a second conductive semiconductor layer 124 formed in this order from the bottom of the sapphire substrate 121. Preferably, the first conductive semiconductor layer 122 is an n-type semiconductor layer and the second conductive semiconductor layer 124 is a p-type semiconductor layer.

The LED chip 100 includes an interconnection layer 130 formed under the second conductive semiconductor layer and over the first and second electrode pads. The interconnection layer 130 includes a conductive reflection layer 131 formed under the second conductive semiconductor layer 124, a first insulating layer 132 formed under the conductive reflection layer 131, an intermediate conductive layer formed under the first insulating layer 132 and consisting of a first intermediate conductive portion 133a and a second intermediate conductive portion 133b spaced apart from each other, a second insulating layer 134 formed under the intermediate conductive layer and to which the underlying first and second electrode pads 142 and 144 spaced apart from each other are bonded, a first via 135 surrounded by an insulating cover and at least penetrating the active layer 123, the second conductive semiconductor layer 124, the conductive reflection layer 131, and the first insulating layer 132 to connect the first conductive semiconductor layer 122 and the first intermediate conductive portion 133a, a second via 136 penetrating the second insulating layer 134 to connect the first intermediate conductive portion 133a and the first electrode pad 142, a third via 137 penetrating the first insulating layer 132 to connect the conductive reflection layer 131 and the second intermediate conductive portion 133b, and a fourth via 138 penetrating the second insulating layer 134 to connect the second intermediate conductive portion 133b and the second electrode pad 144.

The first electrode pad 142 has a smaller area than the first intermediate conductive portion 133a and the second electrode pad 144 has a larger area than the second intermediate conductive portion 133b. The area of the first electrode pad 142 may be identical to that of the second electrode pad 144. With these dimensions, the first electrode pad 142 and the second electrode pad 144 have the largest possible areas and are almost identical in area under given conditions while achieving improved current spreading effect. As a result, the areas of the first solder portion 320 and the second solder portion 340 in contact with the inner portions of the bottom areas of the first electrode pad 142 and the second electrode pad 144, respectively, are maximized and are almost identical, ensuring stable and reliable bonding.

The first solder portion 320 is delimited by the edges of the first electrode pad 142 and connects the first electrode pad 142 to the first electrode 220. The second solder portion 340 is delimited by the edges of the first electrode pad 144 and connects the first electrode pad 144 to the second electrode 240.

Small amounts of the solder material, for example, in the form of a paste, are interposed between the first electrode pad 142 of the LED chip 100 and the first electrode 220 of the substrate 200 and between the second electrode pad 144 of the LED chip 100 and the second electrode pad 144 of the substrate 200. Then, an IR laser is then irradiated to directly pass through the LED chip 100. The IR laser rapidly heats and completely melt the solder material, with the result that the small amounts of the solder material are cured such that the first electrode pad 142 and the second electrode pad 144 are firmly connected to the first electrode 220 and the second electrode 240, respectively. The resulting solder portions have minimum areas and uniform thicknesses.

Each of the first solder portion 320 and the second solder portion 340 has a maximum width in the middle of its thickness. In the case where the reference width of the first solder portion 320 in direct contact with the first electrode pad and the reference width of the second solder portion 340 in direct contact with the second electrode are within the area defined by the edges of the first electrode pad 142 and the area defined by the edges of the second electrode pad 144, respectively, but the maximum widths of the first solder portion 320 and the second solder portion 340 are outside the area defined by the edges of the first electrode pad 142 and the area defined by the edges of the second electrode pad 144, respectively, there is a risk that a portion of light emitted from the LED chip 100 may be absorbed by the first solder portion 320 and the second solder portion 340 and even the first solder portion 320 and the second solder portion 340 may meet each other at their maximum widths, causing shorting. Accordingly, it is preferred that orthogonal projections of the reference widths of the first solder portion 320 and the second solder portion 340 onto the first electrode pad 142 and the second electrode pad 144 are within the area defined by the edges of the first electrode pad 142 and the area defined by the edges of the second electrode pad 144, respectively, and orthogonal projections of the maximum widths of the first solder portion 320 and the second solder portion 340 onto the first electrode pad 142 and the second electrode pad 144 are also within the area defined by the edges of the first electrode pad 142 and the area defined by the edges of the second electrode pad 144, respectively.

As used herein, the term "reference width" of the first solder portion or the second solder portion refers to the width of the solder portion in direct contact with the corresponding electrode pad. As used herein, the term "maximum width" of the first solder portion or the second solder portion refers to the largest cross-sectional width of the solder portion. The formation of the first solder portion 320 and the second solder portion 340 prevents loss of light emission due to the absorption of light by the solder portions and ensures reliable connections between the first electrode pad 142 and the first electrode 220 and between the second electrode pad 144 and the second electrode 240.

In the light emitting element 1, the first electrode pad 142 has the same thickness as the second electrode pad 144 and the thickness and the uppermost height of the first solder portion 320 from the upper surface of the substrate 200 are the same as those of the second solder portion 340.

Figure 4:
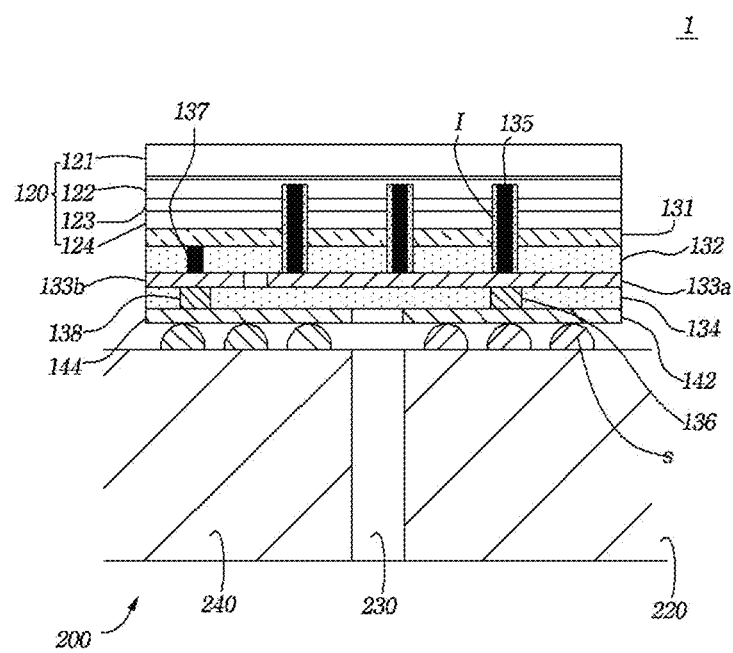
FIGS. 4 and 5 are views explaining a method for fabricating a light emitting element according to one embodiment of the present invention.
Figure 5:
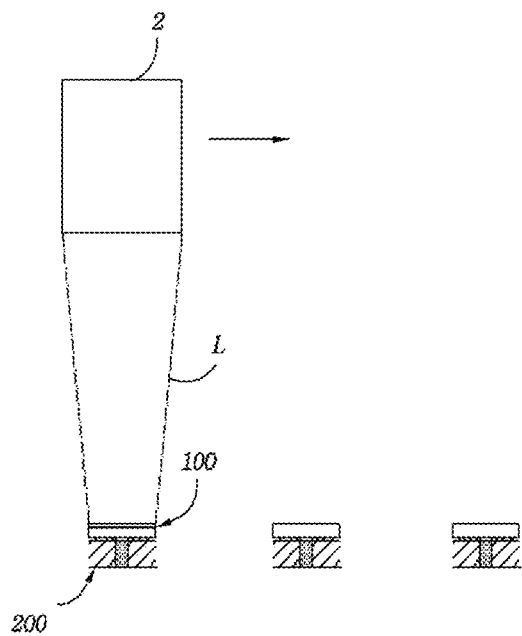

Referring now to FIGS. 4 and 5, a method for fabricating the light emitting element will be explained below.

First, as illustrated in FIG. 4, the solder paste s is applied to a plurality of points on the first electrode 220 of the substrate 200 and a plurality of points on the second electrode 240 of the substrate 200. The LED chip is loaded on the substrate in such a direction that the first electrode pad 142 and the second electrode pad 144 face the first electrode 220 and the second electrode 240, respectively, to interpose the solder paste s between the first electrode pad 142 and the first electrode 220 and between the second electrode pad 144 and the second electrode 240.

The amounts of the solder paste s applied are determined such that the solder does not flow out from the mounting area of the LED chip 100 during laser soldering, which will be explained hereinafter. The points and amounts of the solder paste s applied are determined such that the solder paste is melted and combined by IR laser soldering to form the first and second solder portions.

Then, as illustrated in FIG. 5, an IR laser L is irradiated to pass through the LED chip 100. The IR laser heats the solder paste between the first electrode pad 142 and the first electrode 220 and between the second electrode pad 144 and the second electrode 240 to about 400° C. for complete melting. The direct heating with the IR laser that is directly focused on the solder paste enables uniform heating of the solder paste within the irradiated areas irrespective of parameters in the element, unlike reflow soldering using indirect heat transfer. An IR laser irradiation unit 2 is arranged above the LED chip 100. The IR laser irradiation unit 2 includes an optical guide connected to an IR laser source, a collimator for making laser beams entering through the optical guide parallel to each other, a beam controller for controlling the cross-sectional size of the parallel IR laser beams, and a focusing lens for focusing the parallel IR laser beams whose cross-sectional size is controlled on one point.

The IR laser irradiation unit may further include a laser amplifier, an optical coupler, and a laser oscillation controller. The power of the laser is appropriately selected depending on the melting point of the solder paste. Preferably, the irradiation time of the IR laser L transmitting through the LED chip 100 does not exceed 5 seconds. If the irradiation time exceeds 5 seconds, burning of the LED chip 100 may be caused. The IR laser irradiation unit 2 may participate in the soldering of a plurality of LED chips 100 in a 1:n (n≥2) ratio. In order to solder a plurality of LED chips 100 to the substrate 200 using a single IR laser irradiation unit 2, the IR laser irradiation unit 2 is allowed to move in a linear or zigzag pattern. Alternatively, the substrate 200 and the overlying LED chips 100 are allowed to move such that the LED chips 100 pass through the IR laser irradiated from the IR laser irradiation unit 2 one after the other.

Figure 6:
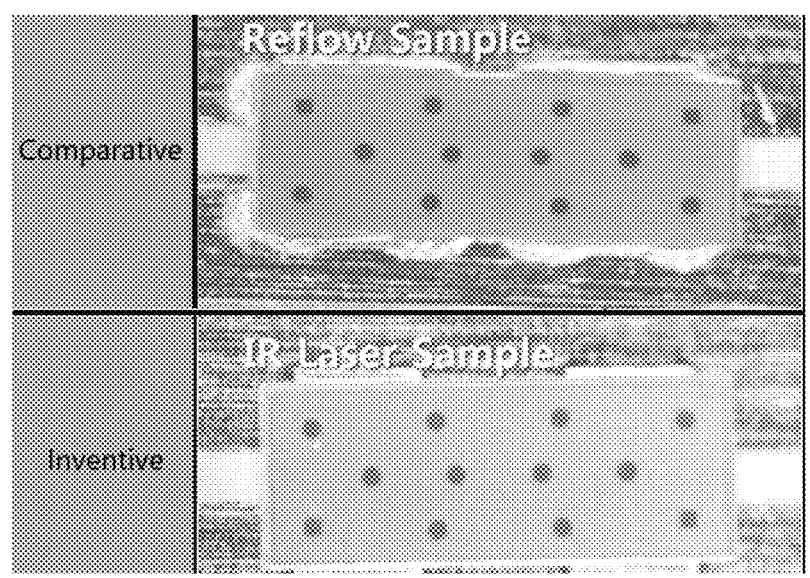
FIG. 6 shows images comparing a light emitting element fabricated based on IR laser bonding and a light emitting element fabricated based on reflow soldering bonding.

FIG. 6 shows images comparing a light emitting element sample fabricated based on reflow soldering and a light emitting element sample fabricated based on IR laser soldering. Referring to FIG. 6, a solder portion did not escape from the mounting area of an LED chip in the sample fabricated based on IR laser soldering. In contrast, a considerable amount of a solder portion escaped from an LED chip in the sample fabricated based on reflow soldering. As shown in Table 1, the luminous efficiency of the white light emitting element fabricated based on IR laser soldering in which the solder portion did not escape from the mounting area of the LED chip was higher than that of the white light emitting element fabricated based on reflow soldering.

TABLE 1

| Bonding type | White TEST Result | | | | | | Solder |
| | VF (V) | lm | Δlm (%) | Cx | Cy | Wp (nm) | Area |
| --- | --- | --- | --- | --- | --- | --- | --- |
| Reflow | 3.10 | 53.41 | 100.0 | 0.262 | 0.230 | 442.5 | Mass production condition |
| IR laser (808 nm) | 3.09 | 55.58 | 104.1 | 0.266 | 0.235 | 442.9 | 100 μm |

The area of voids in the solder portion obtained by IR laser soldering was significantly reduced compared to that in the solder portion obtained by reflow soldering.

What is claimed is:
1. A light emitting element comprising:
an LED chip comprising a light emitting semiconductor stack and first and second electrode pads disposed under the light emitting semiconductor stack;
a substrate mounted with the LED chip and comprising a first electrode corresponding to the first electrode pad and a second electrode corresponding to the second electrode pad;
a first solder interposed between the first electrode pad and the first electrode to connect the first electrode pad and the first electrode; and
a second solder interposed between the second electrode pad and the second electrode to connect the second electrode pad and the second electrode,
wherein each of the first solder and the second solder comprises a solder material melted with a laser to connect the first electrode pad and the second electrode pad to the first electrode and the second electrode, respectively, and
wherein the first electrode pad has a same thickness as the second electrode pad and a thickness and an uppermost height of the first solder from an upper surface of the substrate are the same as those of the second solder.

2. The light emitting element according to claim 1, wherein the LED chip is elongated along a major axis, and wherein the first electrode pad and the second electrode pad are elongated along the major axis of the LED chip and are spaced apart from each other along a minor axis orthogonal to the major axis.

3. The light emitting element according to claim 1, wherein the substrate comprises a linear electrode separator interposed between the first electrode and the second electrode and made of an insulating material.

4. The light emitting element according to claim 1, wherein each of the first solder and the second solder is disposed within a mounting area of the LED chip on the substrate.

5. The light emitting element according to claim 1, wherein the first solder is delimited by an edge of the first electrode pad, and the second solder is delimited by an edge of the second electrode pad.

6. The light emitting element according to claim 1, wherein each of the first solder and the second solder has a reference width in a portion that contacts the first electrode pad and the second electrode pad, respectively, and the reference width is smaller than a maximum width of the respective first or second solder.

7. The light emitting element according to claim 6, wherein the maximum width comprises a largest cross-sectional width of the first solder or the second solder.

8. A light emitting element comprising:
 an LED chip comprising a light emitting semiconductor stack and first and second electrode pads disposed under the light emitting semiconductor stack;
 a substrate mounted with the LED chip and comprising a first electrode corresponding to the first electrode pad and a second electrode corresponding to the second electrode pad;
 a first solder connecting the first electrode pad and the first electrode; and
 a second solder connecting the second electrode pad and the second electrode,
 wherein the first electrode pad and the second pad are elongated along a major axis of the LED chip and are spaced apart from each other along a minor axis orthogonal to the major axis, and
 wherein the first electrode pad has a same thickness as the second electrode pad and a thickness and an uppermost height of the first solder from an upper surface of the substrate are the same as those of the second solder.

9. The light emitting element according to claim 8, wherein the first solder and the second solder are formed within a mounting area of the LED chip on the substrate.

10. The light emitting element according to claim 8, wherein the light emitting semiconductor stack comprises a first conductive semiconductor layer, an active layer, and a second conductive semiconductor layer formed in this order from the top to the bottom,
 wherein an interconnection layer is disposed under the second conductive semiconductor layer and over the first and second electrode pads.

11. The light emitting element according to claim 8, wherein an area of the first electrode pad is identical to that of the second electrode pad.

12. The light emitting element according to claim 8, wherein areas of the first solder and the second solder are smaller than areas of the first electrode pad and the second electrode pad, respectively.

13. The light emitting element according to claim 8, wherein the first solder is delimited by at least one edge of the first electrode pad, and the second solder is delimited by at least one edge of the second electrode pad.

14. The light emitting element according to claim 8, wherein each of the first solder and the second solder has a reference width in a portion that contacts the first electrode pad and the second electrode pad, respectively, and the reference width is smaller than a maximum width of the respective first or second solder.

15. A light emitting element comprising:
 an LED chip comprising a light emitting semiconductor stack and first and second electrode pads disposed under the light emitting semiconductor stack;
 a substrate mounted with the LED chip and comprising a first electrode corresponding to the first electrode pad and a second electrode corresponding to the second electrode pad;
 a first solder connecting the first electrode pad and the first electrode; and
 a second solder connecting the second electrode pad and the second electrode,
 wherein each of the first solder and second solder comprises a solder material heated to connect the first electrode pad and the second electrode pad to the first electrode and the second electrode, respectively, and
 wherein areas of the first solder and the second solder are smaller than areas of the first electrode pad and the second electrode pad, respectively, and
 wherein the first electrode pad has a same thickness as the second electrode pad and a thickness and an uppermost height of the first solder from an upper surface of the substrate are the same as those of the second solder.

16. The light emitting element according to claim 15, wherein the first solder and the second solder are formed within a mounting area of the LED chip on the substrate.

17. The light emitting element according to claim 15, wherein the light emitting semiconductor stack comprises a first conductive semiconductor layer, an active layer, and a second conductive semiconductor layer disposed in this order from the top to the bottom,
 wherein an interconnection layer is disposed under the second conductive semiconductor layer and over the first and second electrode pads.

18. The light emitting element according to claim 15, wherein an area of the first electrode pad is identical to that of the second electrode pad.

19. The light emitting element according to claim 15, wherein the first solder and the second solder are formed by completely melting the solder material with an IR laser and curing the molten solder material.

\* \* \* \* \*